United States Patent [19]
Chai

[11] Patent Number: 6,108,932
[45] Date of Patent: Aug. 29, 2000

[54] METHOD AND APPARATUS FOR THERMOCAPILLARY DRYING

[75] Inventor: An-Ti Chai, deceased, late of Oberlin, Ohio, by Shwu-Chen Chai, legal representative

[73] Assignee: Steag MicroTech GmbH, Germany

[21] Appl. No.: 09/300,251

[22] Filed: Apr. 27, 1999

Related U.S. Application Data

[60] Provisional application No. 60/084,219, May 5, 1998.

[51] Int. Cl.[7] ............................................. F26B 3/34
[52] U.S. Cl. .............................. 34/245; 34/310; 34/351; 34/442; 34/76; 34/78; 34/79
[58] Field of Search .................. 34/308, 310, 337, 34/340, 343, 348, 351, 408, 414, 442, 60, 69, 76, 77, 78, 79, 245; 134/2, 21, 25.4, 30, 95.2, 95.3, 902

[56] References Cited

U.S. PATENT DOCUMENTS

| | | | |
|---|---|---|---|
| 4,251,268 | 2/1981 | Bok | 156/345 |
| 5,369,891 | 12/1994 | Kamikawa | 34/77 X |
| 5,539,995 | 7/1996 | Bran | 34/77 |
| 5,571,337 | 11/1996 | Mohindra et al. | 134/25.4 |
| 5,575,079 | 11/1996 | Yokomizo et al. | 34/78 |
| 5,608,974 | 3/1997 | Tanaka et al. | 34/78 |
| 5,657,553 | 8/1997 | Tarui et al. | 34/78 |
| 5,685,086 | 11/1997 | Ferrell | 34/79 |
| 6,004,399 | 12/1999 | Wong et al. | 134/25.4 X |

*Primary Examiner*—Stephen Gravini
*Attorney, Agent, or Firm*—Connolly Bove Lodge & Hutz

[57] ABSTRACT

A method for thermocapillary drying of substrates includes the step of elevating a submerged substrate away from a rinsing liquid. Such movement of the substrate forms a meniscus on opposite sides of the substrate. The curved raised portion of the meniscus at each side of the substrate is gently heated in such a way as to induce thermocapillary flows, which cause the rinsing fluid to flow away from the substrate so that the withdrawing substrate may be pulled out dry and clean. Heating may be accomplished by directing a warm gas onto the meniscus or by heating the meniscus with rays from a radiation/light source. Apparatus is also provided for performing the various method steps.

16 Claims, 1 Drawing Sheet

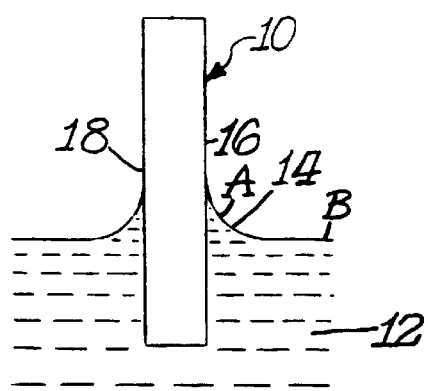
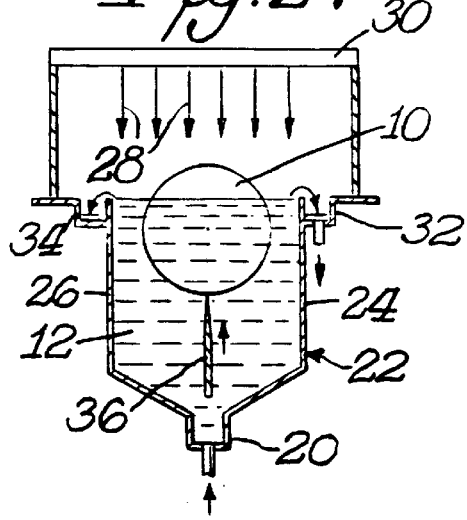
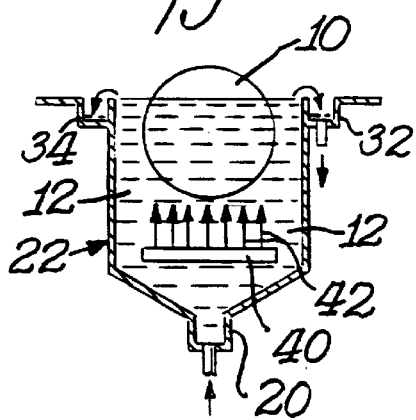
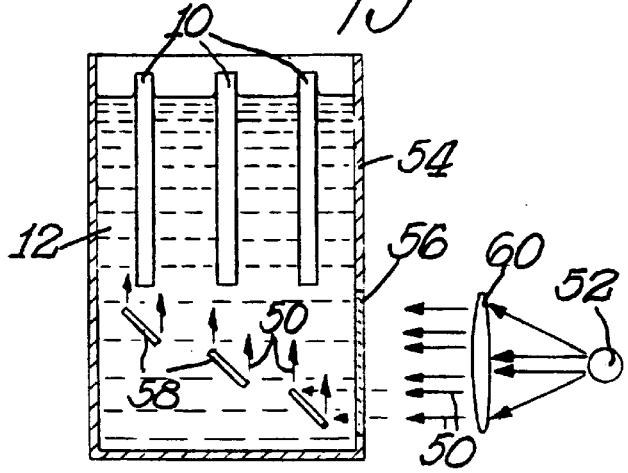
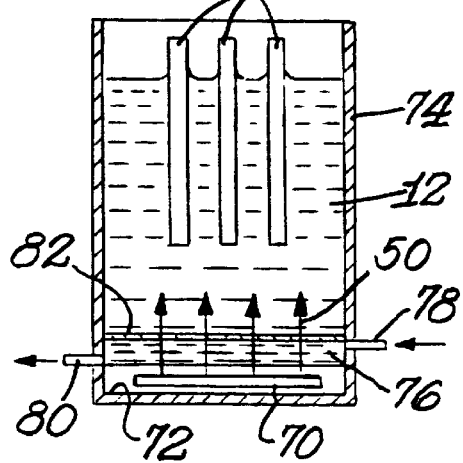
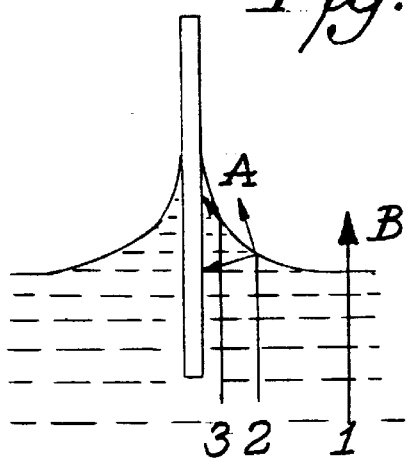

METHOD AND APPARATUS FOR THERMOCAPILLARY DRYING

CROSS-REFERENCE TO RELATED APPLICATION

The present application is related to provisional application Ser. No. 60/084,219 filed May 5, 1998, and the priority of that application is claimed in the present application.

BACKGROUND OF THE INVENTION

The present invention relates to a method and apparatus for drying substrates such as silicon wafers, and more particularly to a method and apparatus for gently heating a meniscus formed at the transition between the substrate surface and a rinsing liquid upon removal of the substrates from the liquid to produce a temperature gradient between the region of the meniscus along the contact line and the adjacent rinsing liquid and thereby induce thermocapillary flows of the liquid away from the substrates.

Prior to the present invention, methods and apparatus have been proposed for drying substrates after treatment in a rinsing liquid. According to one such method, substrates are treated for a period of time in a bath containing the rinsing liquid, and the substrates are then removed so slowly that practically the entire liquid remains within the bath. In so doing, the substrates are brought directly from the liquid into contact with a vapor. The vapor does not condense on the substrate and mixes with the liquid whereby the mixture has a lower surface tension than the liquid. This method, however, is complicated in practice because vapor is required and the vapor must be removed. Supply lines and exhaust nozzles for the vapor must be made available.

These vapors and in some instances chemicals function to reduce the surface tension of the rinsing liquid. One such approach is the Marangoni drying process which uses small amount of isopropyl alcohol as a surfactant to induce a Marangoni flow away from the solid-liquid contact line to achieve drying.

From U.S. Pat. No. 4,722,752 a device and a method for cleaning and drying of disc-shaped substrates, for example, semiconductor wafers, is known in which the substrates are slowly removed from hot water that serves as a rinsing liquid whereby the surface tension at the transition between the surface of the hot water and the substrates has the effect that the water is removed from the surfaces of the substrates.

U.S. Pat. No. 4,920,350 discloses a device and a method for cleaning substrates where energy in the form ultrasound is supplied to the substrate at the surface of the rinsing liquid upon removal of the substrate from the liquid. The supplied energy serves a function unrelated to drying.

SUMMARY OF THE INVENTION

Accordingly, it is an object of the present invention to provide a method and apparatus in which substrates during removal from a rinsing liquid are quickly dried at minimal expenditure, without adversely impacting the environment, and without residues forming on the substrates.

In the present invention, the curved raised portion of a meniscus is gently heated by a gas to effect heat exchange from the gas onto the meniscus. This provides a simple, efficient heating of the meniscus where at least one warm gas stream is generated and directed onto the meniscus and/or the meniscus is surrounded by a warm gas that heats the meniscus. The heating of the meniscus effects to raise the temperature more within the curved raised portion of the meniscus that forms between the substrate surface and the surface of the rinsing liquid upon removal of the substrate from the liquid. A temperature gradient formed between the raised meniscus and the surrounding rinsing liquid produces a surface tension gradient. In this manner, the liquid within the meniscus and adhering to the substrate surface, is moved away from the substrate surface so that the substrate is quickly and reliably freed of the liquid and substantially dried without additional measures during lifting from the liquid. The use of warm gas as an energy transmitting medium for heating the meniscus provides an especially simple and advantageous approach to heating of the meniscus. Complementing the warm gas heating, the continuous overflow of rinse water serves to carry away excessive heat. The net result is to keep a constant temperature gradient, which maintains the desirable thermocapillary flow.

For heating the meniscus of the liquid, warm nitrogen is advantageously used that is guided to the liquid surface such that the liquid in the area of the meniscus along the solid-liquid contact line experiences a greater temperature increase than the liquid area away from the contact line. In doing so, the warm gas may be in the form of a steady gas flow. The gas is preferably introduced via a hood that can be placed above the liquid.

It should be noted that heating in general refers to a heating of the meniscus along the solid-liquid contact line relative to the other areas of the liquid meniscus whereby these temperature differences can be optionally small and even within the magnitude of less than 1° C.

Preferably, the heating gas is an inert gas in order to avoid reactions of or chemical effects on the substrates caused by the gas. As a heating gas, nitrogen is advantageous, but noble gases are also well suited. The gases are preferably not miscible with the liquid.

According to one very advantageous embodiment of the invention, a heat carrying gas is employed that induces a surface tension gradient at the solid-liquid contact line from which the substrates are removed. This thermocapillary effect, also known as the Marangoni effect, contributes to an excellent and fast drying of the substrates. Preferably, the gas for carrying heat to the surface of the liquid is nitrogen, or a gas mixture containing nitrogen. The heating gas is advantageously directed onto the meniscus via a hood which can be placed above the liquid tank from which the substrates are to be removed.

In accordance with the present invention, a method and apparatus for drying substrates has an energy source for heating the raised curved portion of a meniscus which forms upon removal of the substrates from the rinsing liquid at the transition between the substrate surface and the liquid surface. The energy source is a warm gas that surrounds the meniscus or flows onto the meniscus. In either case, the apparatus has a heating device that heats the gas. As an example of such a heating device, infrared or ultrasonic energy sources are advantageous, but eddy current heaters may also be used.

Preferably, the methods and apparatus of the present invention are employed in connection with drying of semiconductor wafers. Efficiency of the drying process and its reliability are improved and the drying period is decreased so that productivity of both the method and apparatus are increased.

In alternate embodiments of the invention, the meniscus is heated by light or radiation from an appropriately positioned source.

BRIEF DESCRIPTION OF THE DRAWINGS

Novel features and advantages of the present invention in addition to those mentioned above will become apparent to persons of ordinary skill in the art from a reading of the following detailed description in conjunction with the accompanying drawing wherein:

FIG. 1 is a diagrammatic view of a vertical substrate partially submerged in a rinsing liquid with a raised meniscus at both sides of the substrate;

FIG. 2 is a side elevational view of the substrate of FIG. 1 partially submerged in a rinsing liquid with warm nitrogen gas directed onto the meniscus at both sides of the substrate, according to the present invention;

FIG. 3 is a diagrammatic view of an alternate embodiment of the present invention where a vertical substrate is partially submerged in a rinsing liquid and light or radiation from a source in the liquid is directed onto the meniscus at both sides of the substrate;

FIG. 4 is a diagrammatic view of an another embodiment of the present invention where a plurality of substrates are partially submerged in a rinsing liquid and light or radiation from a source away from the liquid is directed onto the meniscus at both sides of each substrate;

FIG. 5 is a diagrammatic view of still another embodiment of the present invention where a plurality of vertical substrates are partially submerged in a rinsing liquid and light or radiation from a source below the rinsing liquid is directed onto the meniscus at both sides of each substrate; and FIG. 6 is a diagrammatic view similar to FIG. 1 illustrating the tracing of light or radiation rays directed onto the meniscus.

DETAILED DESCRIPTION OF THE INVENTION

Referring in more particularity to the drawing, FIG. 1 diagrammatically illustrates a vertical substrate 10 such as a silicon wafer partially submerged in a rinsing liquid 12 with a meniscus 14 formed near both sides 16, 18 of the substrate. Region A represents a region near the contact line between the liquid and the substrate whereas region B is farther away from the contact line. By maintaining the temperature of region A higher than that of region B, the surface tension at region A is lower than that of region B, and a surface tension gradient is established. Consequently, a thermocapillary flow from region A to region B results, very similar to the prior art Marangoni flow induced by the introduction of isopropal alcohol.

One procedure for maintaining the temperature in region A higher than that in region B is to use a constant overflow setup in the bath for the rinsing liquid, as best illustrated in FIG. 2. Fresh rinsing fluid 12, such as deionized water, is introduced from the bottom 20 of a rinse tank 22 at or below ambient temperature. The rinsing liquid flows out of the tank at a suitable constant speed from two sides 24, 26 of the tank. Dry, inert, and non-condensable gas, such as nitrogen 28 is introduced from the top of a rinse tank lid or cover 30 at a temperature higher than that of the rinsing liquid (higher than or at ambient temperature). The flow of such gas 28 is uniformly directed downward onto the surface of the rinsing liquid. Preferably, lid or cover 30 is not closed or sealed to thereby prevent the accumulation of any pressure above ambient. A constant suitable gas flow is maintained.

The overflow of the rinsing liquid 12 is directed to flow from the top center of tank 22 toward both sides 24, 26 of the tank where overflow ports 32, 34 are located. The flows of rinsing liquid are parallel to the surfaces of the substrates to be dried. Moreover, the speed of the flow of rinsing liquid diminishes as the liquid gets closer to the solid surface, particularly along contact lines of the substrate and the rinsing liquid. A warmer gas flow effectively raises the temperature of a thinner layer than that of a thicker one.

Solid silicon wafers have considerably better thermal conductivity than the rinsing liquid so that the temperature in region A is maintained higher than that in region B at a desirable level. Consequently, a thermocapillary flow of the rinsing liquid is induced from region A to region B.

The thermocapillary flow combined with the fresh rinse liquid in-flow from below and the out-going surface overflow parallel and away from the wafer surfaces constitute continuous flow motions in the rinsing liquid. As the wafers are carefully raised or lifted at a speed not to disturb the continuous flow, the wafer surfaces are withdrawn clean and dry as if the rinsing liquid voluntarily flows away from the surfaces. A device 36 is provided for lifting and lowering the substrates.

The temperature differential between regions A and B is preferably in the range of 0.1° to 5° C., most preferably 0.1° to 2° C. Small differential temperatures within these ranges produce the desired thermocapillary flows without excessively heating the meniscus which might otherwise cause unwanted evaporation of the rinsing liquid.

FIG. 3 illustrates an alternate embodiment of the present invention similar in some respects to the arrangement of FIG. 2, and similar reference characters have been used to identify similar parts. The embodiment of FIG. 3 is different in that a light or radiation source 40 is located in the bath of rinsing liquid for directing light or radiation rays 42 onto meniscus 14 at each side 16, 18 of the substrate 10. The use of visible light is a practical approach because substances such as water, glass, clear acrylic, quartz, and the like are transparent to visible light. Hence, there should not be any unwanted absorption problems associated with using such light sources. Visible light not only avoids unwanted absorption but it easily becomes trapped near the solid-liquid contact line for heating purposes.

The light or radiation source 40 is arranged in a way, as shown in FIG. 3, such that uniform and parallel light or radiation is directed upward from the bottom of the tank of rinsing liquid and perpendicular to the flat, leveled liquid-gas (or air) interface between wafers. As a result, desirable heating is achieved along each and every contact line at the interface of the rinsing liquid 12 and the sides 16, 18 of the substrate 10.

The overall approach is best explained in conjunction with FIG. 6. Ray 1 represents light or radiation incident on the liquid-gas interface with zero incident angle. It goes through the interface without losing any appreciable energy. Ray 2 represents light or radiation incident on the liquid-gas interface near the bottom of the curved meniscus. Its energy is partially reflected into the liquid and partially refracted into the gas (or air) above the interface. Ray 3 represents light or radiation incident on the liquid-gas interface with an incident angle greater than the critical angle. Total internal reflection occurs and no energy passes through the liquid-gas interface. Because of total internal reflection, the light or radiation near the contact line is trapped and absorbed between the liquid and the wafer surface near the contact line. Hence region A is maintained at a higher temperature than that of region B as depicted in FIG. 6. Consequently, a thermocapillary flow is induced from region A to region B. Here again, the temperature differential between regions A and B is relatively small and preferably within the range of 0.1 to 5° C., most preferably 0.1° to 2° C. Excessive heating of the meniscus and the accompanying evaporation of the rinsing liquid are avoided.

The absorption occurring at the meniscus region near the contact lines is non-selective. The light/radiation simply becomes trapped in the raised region of the rinse liquid between the meniscus and the surface of the substrate.

FIG. 4 illustrates a further embodiment of the invention where heat generating radiation or light 50 emanates from a source 52 outside a tank 54 of rinsing liquid. Specifically, the rinsing liquid tank 54 holding the liquid has a transparent side window 56. Appropriately angled mirrors 58 are positioned in the tank to reflect the rays of radiation or light upward around each of the vertical substrates 10 submerged in the rinsing liquid. A diverging optical device 60 is positioned between the radiation or light source 52 and the slanted mirrors 58 to cast the rays uniformly onto the surface of the mirrors. A continuous rinse water flow similar to the arrangements of FIGS. 2 and 3 may also be utilized with the embodiment of FIG. 4. However, the mirror set should be arranged well below the surface of the rinsing liquid and in such a manner that the mirrors do not obstruct the continuous rinse water overflow.

The results achieved by the embodiment of FIG. 4 are the same as described above and as illustrated in FIG. 6.

In a still further embodiment of the present invention, a radiation/light source 70 is positioned in a water-tight compartment 72 directly below the bottom of a rinsing liquid tank 74, as shown in FIG. 5. A cooling chamber 76 functioning as a heat exchanger is positioned between the radiation/light source 70 and the bottom of the rinsing liquid tank to alleviate unwanted convection normally caused by the unavoidable heating effect generated at the radiation/light source. A simple tap water inlet 78 and an accompanying drain 80 on the cooling chamber enable cooling liquid to flow through the chamber. Bottom 82 of tank 74 and the walls of the cooling chamber are transparent to facilitate transmission of the rays from the radiation/light source onto the meniscus on each side of each substrate. The effect is the same as explained above and as illustrated in FIG. 6. Moreover, the tank of FIG. 5 may incorporate the continuous rinse water overflow shown in FIGS. 2 and 3.

Heat carrying gas, such as shown in FIG. 2 may be utilized in combination with light/radiation heating, such as shown in FIGS. 3–5, to accomplish thermocapillary drying in accordance with the present invention.

What is claimed is:

1. A method of drying substrates comprising the steps of elevating a submerged substrate away from the top surface of a rinsing liquid, forming a meniscus on opposite sides of the substrate along solid-liquid contact lines, and heating the meniscus at each side of the substrate to establish a surface tension gradient between the solid-liquid contact line and adjacent regions of the rinsing liquid whereby the liquid is stripped from the substrate by thermocapillary forces.

2. A method as in claim 1 wherein the step of heating includes directing a warm gas onto the meniscus at each side of the substrate.

3. A method as in claim 2 wherein the warm gas is nitrogen.

4. A method as in claim 2 wherein the warm gas is directed onto the meniscus at each side of the substrate from above the substrate.

5. A method as in claim 2 including the step of circulating the rinsing liquid away from the substrate along flow lines at the top surface of the rinsing liquid.

6. A method as in claim 1 wherein the step of heating includes directing radiation/light onto the meniscus at each side of the substrate.

7. A method as in claim 6 wherein the radiation/light is directed onto the meniscus at each side of the substrate from below the substrate.

8. A method as in claim 6 including the step of locating a radiation/light source in the rinsing liquid below the substrate.

9. A method as in claim 6 including the step of locating a radiation/light source below the rinsing liquid.

10. A method as in claim 9 including the step of providing a heat exchanger between the radiation/light source and the rinsing liquid to reduce the heating effect caused by the radiation/light source.

11. A method as in claim 6 including the step of locating a radiation/light source to at least one side of the rinsing liquid and reflecting the radiation/light onto the meniscus at each side of the substrate.

12. A method as in claim 6 including the step of circulating the rinsing liquid away from the substrate along flow lines at the top surface of the rinsing liquid.

13. Apparatus for drying substrates comprising a tank of rinsing liquid in which at least one substrate is submerged, means for slowly lifting the substrate out of the rinsing liquid so that a meniscus is formed on opposite sides of the substrate along solid-liquid contact lines, heating means for elevating the temperature of the meniscus at each side of the substrate to establish a surface temperature gradient between the solid-liquid contact lines and adjacent regions of the rinsing liquid whereby the rinsing liquid is stripped from the substrate by thermocapillary forces as it is lifted out of the rinsing liquid.

14. Apparatus for drying substrates as in claim 13 wherein the heating means comprises a flow of heated gas.

15. Apparatus for drying substrates as in claim 14 wherein the heated gas is nitrogen.

16. Apparatus for drying substrates as in claim 13 wherein the heating means is a radiation/light source.

\* \* \* \* \*